(12) United States Patent
Shim

(10) Patent No.: US 9,257,488 B2
(45) Date of Patent: Feb. 9, 2016

(54) ORGANIC LIGHT EMITTING DIODE DISPLAY PANEL AND PORTABLE DISPLAY INCLUDING THE SAME

(71) Applicant: Samsung Display Co., Ltd., Yongin, Gyeonggi-Do (KR)

(72) Inventor: Byung-Chang Shim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 29 days.

(21) Appl. No.: 14/027,450

(22) Filed: Sep. 16, 2013

(65) Prior Publication Data

US 2014/0077196 A1    Mar. 20, 2014

(30) Foreign Application Priority Data

Sep. 19, 2012   (KR) .......................... 10-2012-0104227

(51) Int. Cl.
*H01L 27/32*   (2006.01)
*G02F 1/1368*  (2006.01)

(52) U.S. Cl.
CPC .......... *H01L 27/3213* (2013.01); *G02F 1/1368* (2013.01); *H01L 27/326* (2013.01); *H01L 27/3216* (2013.01); *H01L 27/3225* (2013.01); *H01L 27/3246* (2013.01); *H01L 27/3262* (2013.01); *H01L 27/3267* (2013.01)

(58) Field of Classification Search
CPC ............ H01L 27/3237; H01L 27/3225; H01L 27/3267

See application file for complete search history.

(56) References Cited

U.S. PATENT DOCUMENTS

| | | | |
|---|---|---|---|
| 2009/0189162 A1* | 7/2009 | Kim | ............................... 257/72 |
| 2011/0273409 A1 | 11/2011 | Lee et al. | |
| 2012/0056916 A1 | 3/2012 | Ryu et al. | |
| 2012/0097928 A1* | 4/2012 | Kim et al. | ...................... 257/40 |
| 2012/0286295 A1 | 11/2012 | Han | |

FOREIGN PATENT DOCUMENTS

| | | | |
|---|---|---|---|
| KR | 10-2005-0002143 | | 1/2005 |
| KR | 10-2006-0019688 | | 3/2006 |
| KR | 10-2007-0043253 | * | 4/2007 |

* cited by examiner

*Primary Examiner* — Daniel Luke
(74) *Attorney, Agent, or Firm* — Robert E. Bushnell, Esq.

(57) ABSTRACT

An organic light emitting display panel that includes a substrate, a plurality of pixels disposed on the substrate and forming a matrix, and an auxiliary organic light emitting element disposed at a distance from the pixel.

9 Claims, 14 Drawing Sheets

ORGANIC LIGHT EMITTING DIODE DISPLAY PANEL AND PORTABLE DISPLAY INCLUDING THE SAME

CLAIM PRIORITY

This application makes reference to, incorporates the same herein, and claims all benefits accruing under 35 U.S.C. §119 from an application earlier filed in the Korean Intellectual Property Office on 19 Sep. 2012 and there duly assigned Serial No. 10-2012-0104227.

BACKGROUND OF THE INVENTION

1. Field of the Invention

The described technology relates generally to a portable display device.

2. Description of the Related Art

A portable display device has various shapes and functions for convenience of a user, and includes a display panel for displaying entire information of a portable phone and a window for protection of the display panel from an external impact.

The display panel is a liquid crystal display (LCD), or may be an organic light emitting diode (OLED) display and displays an image with a plurality of pixels.

The above information disclosed in this Related Art section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an organic light emitting display panel that can provide aesthetic beauty by matching a light blocking unit that displays various colors rather than a black color in a standby state, and a portable display device including the same.

An organic light emitting display panel according to an exemplary embodiment includes a substrate, a plurality of pixels disposed on the substrate and forming a matrix, and an auxiliary organic light emitting element disposed at a distance from the pixel.

Each pixel may include a first thin film transistor disposed on the substrate and an organic light emitting element connected with the first thin film transistor.

The organic light emitting element may include a lower electrode, an organic emission layer disposed on the lower electrode, and an upper electrode disposed on the organic emission layer, and the auxiliary organic light emitting element may include an auxiliary lower electrode, an auxiliary organic emission layer disposed on the auxiliary lower electrode, and an auxiliary upper electrode disposed on the auxiliary upper electrode.

The lower electrode and the auxiliary lower electrode may be insulated from each other.

The upper electrode and the auxiliary upper electrode may be integrally formed.

The auxiliary organic light emitting element may be disposed between the respective pixels, or may surround the pixels.

An organic light emitting display panel according to an exemplary embodiment includes: a substrate; a gate line disposed on the substrate; a data line and a constant voltage line crossing the gate line in an insulated manner; a first thin film transistor connected with the gate line and the data line; a second thin film transistor connected with the first thin film transistor and the constant voltage line; a lower electrode connected with the second thin film transistor; a pixel defining layer disposed on the first lower electrode and exposing the lower electrode; an organic emission layer disposed in the opening; an auxiliary lower electrode disposed on the pixel defining layer; an auxiliary organic emission layer disposed on the auxiliary lower electrode; an upper electrode disposed on the organic emission layer; and an auxiliary upper electrode disposed on the auxiliary organic emission layer.

The upper electrode and the auxiliary upper electrode may be integrally formed.

The organic light emitting display panel may further include a recess portion formed on an upper portion of the pixel defining layer, and the auxiliary upper electrode may be disposed in the recess portion.

The auxiliary organic emission layer may be disposed in the recess portion.

The organic light emitting display panel may further include an auxiliary opening disposed on the pixel defining layer and exposing the auxiliary lower electrode, and the auxiliary organic emission layer may be disposed in the auxiliary opening.

A signal that is different from signals applied to the data line and the constant voltage line may be applied to the auxiliary lower electrode.

The same signal applied to the constant voltage line may be applied to the auxiliary lower electrode.

In a portable display device according to an exemplary embodiment, the portable display device includes a display panel and a window disposed on the display panel and including a light blocking unit and a light transmission unit, and when the portable display device is in a standby state, a front surface of the display panel displays at least one of chromatic colors.

The light transmission unit may correspond to the display panel and the light blocking unit may surround the light transmission unit.

When the portable display device is in the standby state, the display panel may display the same color of the light blocking unit.

When the portable display device is in the standby state, the display panel may display a complementary color of the light blocking unit.

When the portable display device is in the standby state, the display panel may display gradual deviation of a color wavelength.

According to the present invention, the portable display device can display colors that match the light blocking unit of the window in the standby state by forming the auxiliary light emitting element, thereby providing aesthetic beauty.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
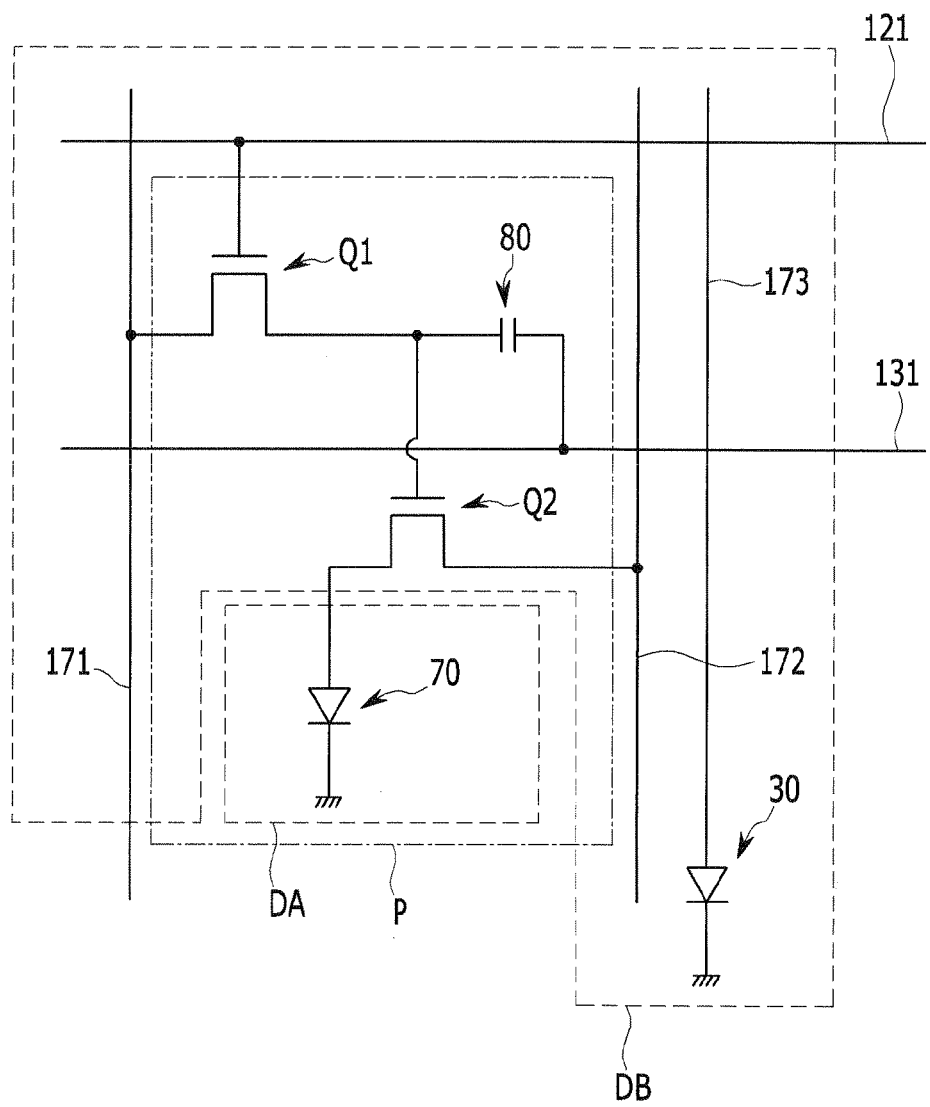
FIG. 1 is an equivalent circuit diagram of an organic light emitting display panel according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, the size and thickness of each configuration shown in the drawings are arbitrarily shown for understanding and ease of description, but the present invention is not limited thereto.

In the drawings, the thickness of layers, films, panels, regions, etc., are exaggerated for clarity. Further, in the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. It will be understood that when an element such as a layer, film, region, or substrate is referred to as being "on" another element, it can be directly on the other element or intervening elements may also be present.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The display panel of a portable display device may be displayed as black in a standby state. Since no image is displayed in an organic light emitting display panel in a standby state, power is not supplied to an organic light emitting element. Thus, the organic light emitting element does not emit light and accordingly the display panel is displayed as black.

The window protecting the display panel may be formed of a transparent material such as polymer resin or glass, and includes a light transmission part for visibility of an image displayed in the display panel. In addition, a portion where the edge of the display panel and the window are coupled is shielded by a light blocking unit, and accordingly the internal structure cannot be viewed from the outside.

Such a light blocking unit is formed by a dark color such as a black color to shield the inside, but portable display devices having various colors of light blocking units have been developed to satisfy various users needs.

Compared to the light blocking unit that displays various colors, the display panel always displays the black color, which doesn't match the various colors of the light blocking unit so that aesthetic beauty cannot be provided.

Hereinafter, a repairing unit according to an exemplary embodiment will be described with reference to the drawings.

FIG. 1 is an equivalent circuit diagram of an organic light emitting display panel according to an exemplary embodiment.

As shown in FIG. 1, the organic light emitting display panel according to the exemplary embodiment includes a plurality of pixels P arranged in a matrix and an auxiliary organic light emitting element 30 disposed at a distance from the pixel P.

Each pixel P has a 2Tr-1Cap structure with an organic light emitting diode 70, two thin film transistors (TFTs) Q1 and Q2 and a capacitor 80. However, the exemplary embodiment is not limited thereto. The organic light emitting diode display 101 may be variously structured such that three or more thin film transistors and two or more capacitors are provided at one pixel PE together with separate wirings The additional thin film transistor and capacitors form a compensation circuit.

***The compensation circuit improves the uniformity of the organic light emitting diode 70 formed at each pixel PE, and prevents the image quality from being deviated. The compensation circuit includes two to eight thin film transistors.

The organic light emitting diode 70 includes an anode being a hole injection electrode, a cathode being an electron injection electrode, and an organic emissive layer disposed between the anode and the cathode.

With an exemplary embodiment, one pixel PE includes a first thin film transistor Q1 and a second thin film transistor Q2.

The first thin film transistor Q1 and the second thin film transistor Q2 respectively include gate electrodes, semiconductors, source electrodes, and drain electrodes. In addition, a semiconductor of at least one of the first and second thin film transistors Q1 and Q2 includes an amorphous silicon layer and a polysilicon layer doped with microcrystalline silicon or an impurity.

FIG. 1 illustrates a gate line 121, a data line 171, and a constant voltage line 172, and a capacitor line 131, but the capacitor line 131 may be omitted as necessary.

A source electrode of the thin film transistor Q1 may be connected to the data line 171 and a gate electrode of the first thin film transistor Q1 may be connected to the gate line 121. A drain electrode of the first thin film transistor Q1 may be connected to the capacitor line 131 through the capacitor 80. A node may be formed between the drain electrode of the first thin film transistor Q1 and the capacitor 80 and thus a gate electrode of the second thin film transistor Q2 may be connected to the node. In addition, the constant voltage line 172 may be connected to a source electrode of the second thin film transistor Q2, and a drain electrode of the second thin film transistor Q2 may be connected with an anode of organic light emitting element 70.

The first thin film transistor Q1 may be used as a switch to select of a pixel P for light emission. When the first thin film transistor Q1 is instantaneously turned on, the capacitor 80 is charged and the amount of charges charged at this point is proportional to a potential of a voltage applied from the data line 171. In addition, when a voltage increasing signal may be input for each frame cycle to the capacitor line 131 in the turn-off state of the first thin film transistor Q1, a gate potential of the second thin film transistor Q2 may be increased along a voltage applied through the capacitor line 131. Here, the voltage has a level of a voltage applied with reference to the potential charged in the capacitor 80. The second thin film transistor Q2 may be turned on when the gate potential exceeds a threshold voltage. Then, a voltage applied to the constant voltage line 172 may be applied to the organic light emitting element 70 through the second thin film transistor Q2 such that the organic light emitting element 70 emits light.

The auxiliary organic light emitting element 30 may be disposed in a non-light emission area DB. An area corresponding to the organic emission layer of the organic light emitting element 70 and through which light emitted from the organic emission layer is passed is referred to as a light emission area DA. In addition, areas excluding the light emission area DB become the non-light emission area DB. In the non-light emission area DB, the auxiliary organic light emitting element, the second thin film transistor, the capacitor, wirings such as the gate line, the data line, and the constant voltage line and circuit elements may be disposed.

The auxiliary organic light emitting element 30 may have the same interlayer structure as the organic light emitting element 70, and an auxiliary anode 173, which may be a hole injection electrode, an auxiliary cathode, which may be an electron injection electrode, and an auxiliary organic emission layer disposed between the anode and the cathode. The auxiliary anode may be connected with the auxiliary anode 173, and the auxiliary cathode may be connected with the cathode of the organic light emitting element 70. The auxiliary anode 173 and the constant voltage line 172 may be input with the same signal. In addition, the constant voltage line 172 and the auxiliary anode 173 may be input with different signals.

Hereinafter, a structure of the organic light emitting display panel according to the exemplary embodiment will be described in detail according to the lamination order with reference to FIG. 1.

Figure 2:
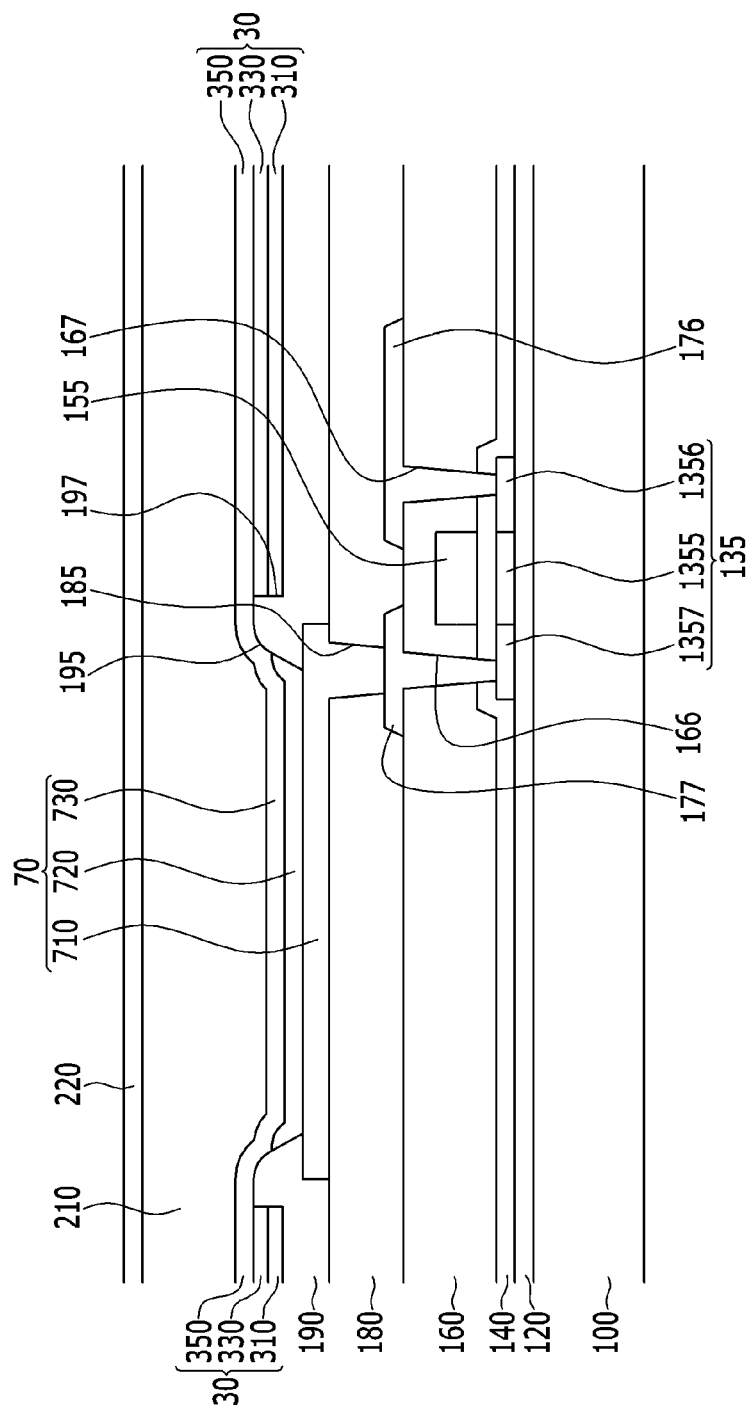
FIG. 2 is a cross-sectional view of the organic light emitting display panel according to the exemplary embodiment.
Figure 3:
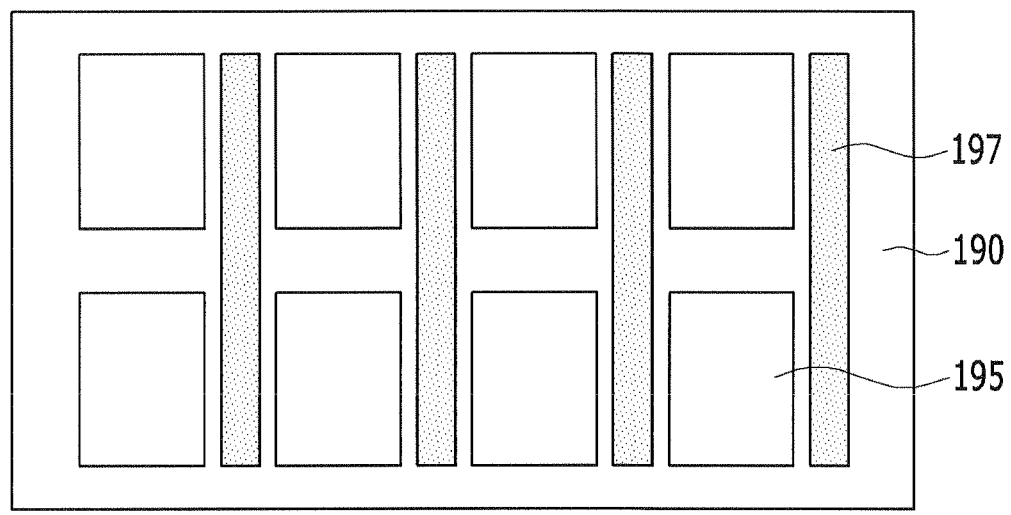
FIG. 3 to FIG. 5 are layout views of a recess portion of an organic light emitting display panel according to another exemplary embodiment.
Figure 4:
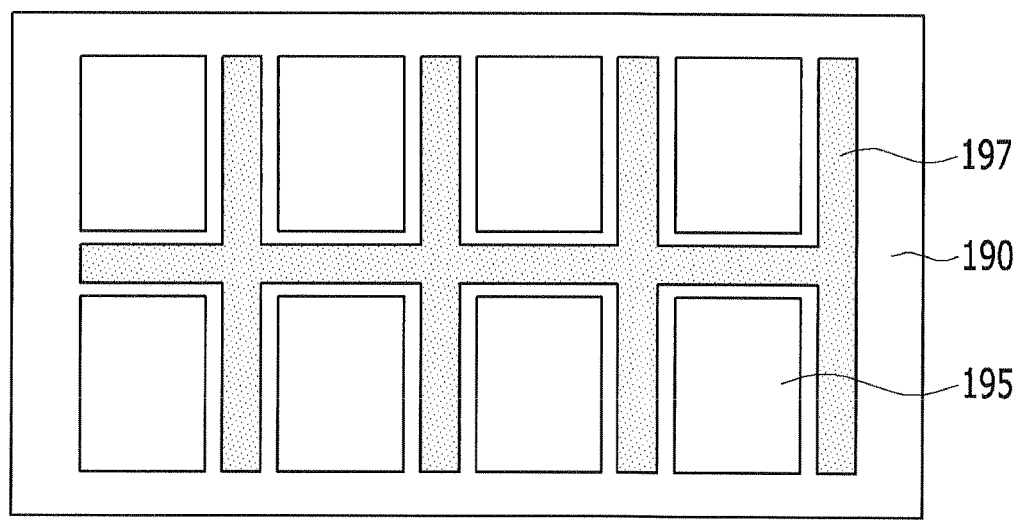
Figure 5:
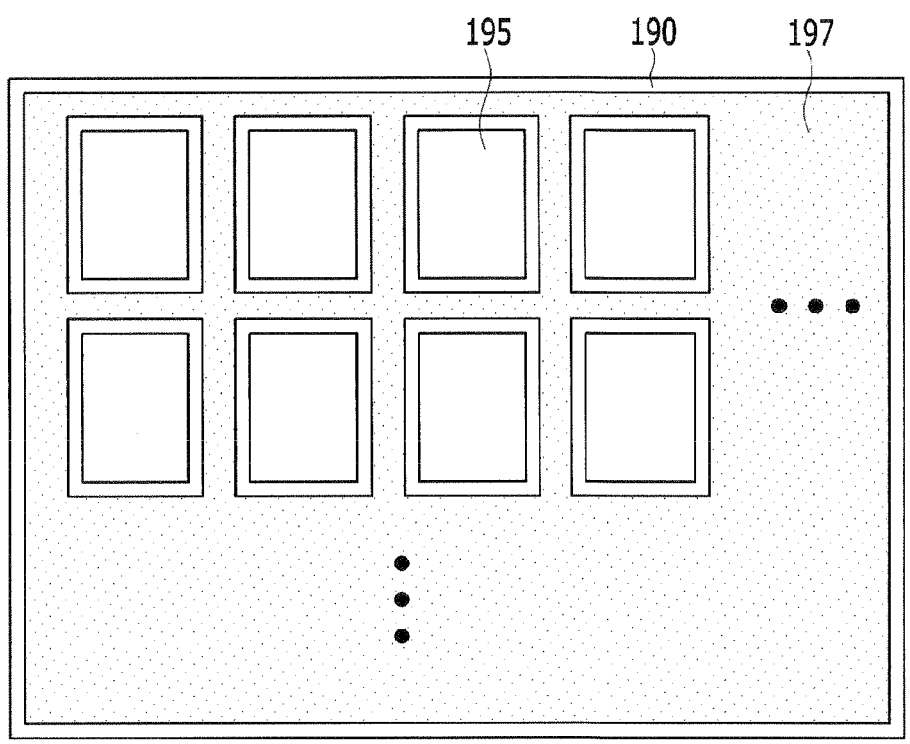

FIG. 2 is a cross-sectional view of the organic light emitting display panel according to the exemplary embodiment, and FIG. 3 to FIG. 5 are layout views of a recess portion according to another exemplary embodiment.

The structure of the thin film transistor will be described, focused on the organic light emitting element 70 and the second thin film transistor Q2 connected to the organic light emitting element 70. The first thin film transistor Q1 has a similar layering structure of the second thin film transistor Q2 and therefore no further description will be provided. Hereinafter, the second thin film transistor Q2 will be referred to as a thin film transistor.

As shown in FIG. 2, a buffering layer 120 may be formed on the substrate 100.

The substrate 100 may be an insulating substrate formed of glass, quartz, ceramic, or plastic, and the substrate 100 may be a metallic substrate formed of stainless steel.

The buffering layer 120 may have a single-layered structure of silicon nitride (SiNx), or a double-layered structure of silicon nitride (SiNx) and silicon oxide (SiO2). The buffering layer 120 has a role of preventing unneeded components like impure elements or moisture from intruding into the target, while flattening the surface thereof at the same time.

A semiconductor 135 formed of polysilicon may be formed on the buffering layer 120.

The semiconductor 135 may be divided into a channel area 1355, a source area 1356, and a drain area 1357. The source area 1356 and the drain area 1357 are formed in lateral sides of the channel area 1355. The channel area 1355 of the semiconductor 135 may be polysilicon not doped with an impurity, that is, an intrinsic semiconductor. The source area 1356 and the drain area 1357 of the semiconductor 135 are polysilicon doped with a conductive impurity, that is, impurity semiconductors.

The impurity doped to the source area 1356 and the drain area 1357 may be one of a p-type impurity and an n-type impurity.

A gate insulating layer 140 may be formed on the semiconductor 135. The gate insulating layer 140 may be a single or multi-layer including at least one of tetra ethyl ortho silicate (TEOS), silicon nitride, and silicon oxide.

A gate electrode 155 may be formed on the gate insulating layer 140. The gate electrode 155 may be overlapped with the channel area 1355, and may be formed of a single layer of a multiple layer of tungsten, molybdenum, aluminum, or an alloy thereof.

An interlayer insulating layer 160 may be formed on the gate electrode 155. Like the gate insulating layer 140, the interlayer insulating layer 160 may be formed of tetra ethyl ortho silicate (TEOS), silicon nitride, or silicon nitride.

The interlayer insulating layer 160 and the gate insulating layer 140 have a source contact hole 166 and a drain contact hole 167 respectively exposing the source area 1356 and the drain area 1357.

A source electrode 176 and a drain electrode 177 are formed on the interlayer insulating layer 160. The source electrode 176 may be connected with the source area 1356 through the source contact hole 166, and the drain electrode 177 may be connected with the drain area 1357 through the drain contact hole 167. The source electrode 176 and the drain electrode 177 may respectively be formed of a single layer of a multiple layer of tungsten, molybdenum, aluminum, or an alloy thereof.

A protective layer 180 may be formed on the interlayer insulating layer 160. The protective layer 180 includes a contact hole 185 exposing the drain electrode 177.

A lower electrode 710 connected with the drain electrode 177 through the contact hole 185 may be formed on the protective layer 180. The lower electrode 710 becomes the anode of the organic light emitting element.

A pixel defining layer 190 may be formed on the lower electrode 710.

The pixel defining layer 190 includes openings 195 and recess portions 197. The opening 195 exposes the lower electrode 710. The recess portion 197 may be concave downward from an upper surface of the pixel defining layer 190, and may be formed in the shape of various planes as shown in FIG. 3 to FIG. 5.

That is, as shown in FIG. 3 and FIG. 4, the recession portion 197 may be extended along a row or a column of the matrix of the opening 195 between the openings 195, or may surround the openings 195 as shown in FIG. 5.

The opening 195 and the recess portion 197 may be simultaneously formed using half-tone exposure or slit exposure.

The pixel defining layer 19 may be formed including a resin such as polyacrylates or polyimides and an inorganic material such as silica.

An organic emission layer 720 may be formed in the opening of the pixel defining layer 190.

The organic emission layer 720 may be formed as a multi-layer including one or more of a light emission layer, a hole injection layer (HIL), a hole transport layer (HTL), an electron transport layer (ETL), and an electron injection layer (EIL).

If the organic emission layer 720 includes all of them, the electron injection layer may be disposed on the negative electrode 710, on which the electron transport layer, the organic emission layer, the hole transport layer, and the hole injection layer are then sequentially stacked.

An auxiliary lower electrode 310 may be formed in the recess portion 197 of the pixel defining layer 190. The auxiliary lower electrode 310 may be formed of a single layer of a multiple layer of tungsten, molybdenum, aluminum, or an alloy thereof.

The auxiliary organic emission layer 330 may be formed on the auxiliary lower electrode 310. The auxiliary organic emission layer 330 includes a multiple layer including at least one of a hole transport layer (HTL), a hole transport layer (HTL), an electron transport layer (ETL), and an electron injection layer (EIL). An upper layer 730 and an auxiliary upper electrode 350 are formed on the organic emission layer 720 and the auxiliary organic emission layer 330.

The upper electrode 730 becomes the cathode of the organic light emitting element 70 of FIG. 1, and the auxiliary upper electrode 350 becomes the cathode of the auxiliary organic light emitting element 30. Thus, the lower electrode 710, the organic emission layer 720, and the upper electrode 730 form the organic light emitting element 70, and the auxiliary lower electrode 310, the auxiliary organic emission layer 330, and the auxiliary upper electrode 350 form the auxiliary organic light emitting element 30.

FIG. 2 illustrates that the upper electrode 730 and the auxiliary upper electrode 350 are integrally formed, but they may be separately formed (not shown). The organic light emitting element 70 according to the exemplary embodiment may be formed as a front emission type, and the lower electrode 710 may be formed as a reflective layer and the upper electrode 730 may be formed as a semi-transparent or transparent layer.

The reflective layer and the semi-transparent layer are formed of at least one of magnesium (Mg), silver (Ag), gold (Au), calcium (Ca), lithium (Li), chromium (Cr), and aluminum (Al), or an alloy thereof. The reflective layer and the semi-transparent layer are determined by the thickness of the reflective material, and the thickness of the semi-transparent layer may be less than 200 nm. Light transmittance is increased as the thickness is increased, but resistance is increased when the thickness is too thin.

The transparent layer may be formed of a material such as indium tin oxide, indium zinc oxide, zinc oxide, or indium oxide ($In_2O_3$).

A filler 210 may be formed on the upper electrode 730 and the auxiliary upper electrode 350, and a window 220 may be attached on the filler 210. The window may be attached by an adhesive (not shown).

The filler 210 includes a sealing material for protection of the organic light emitting element, and the window 220 includes a transmission unit corresponding to the pixel and a light blocking unit corresponding to the edge of the organic light emitting display panel.

Figure 6:
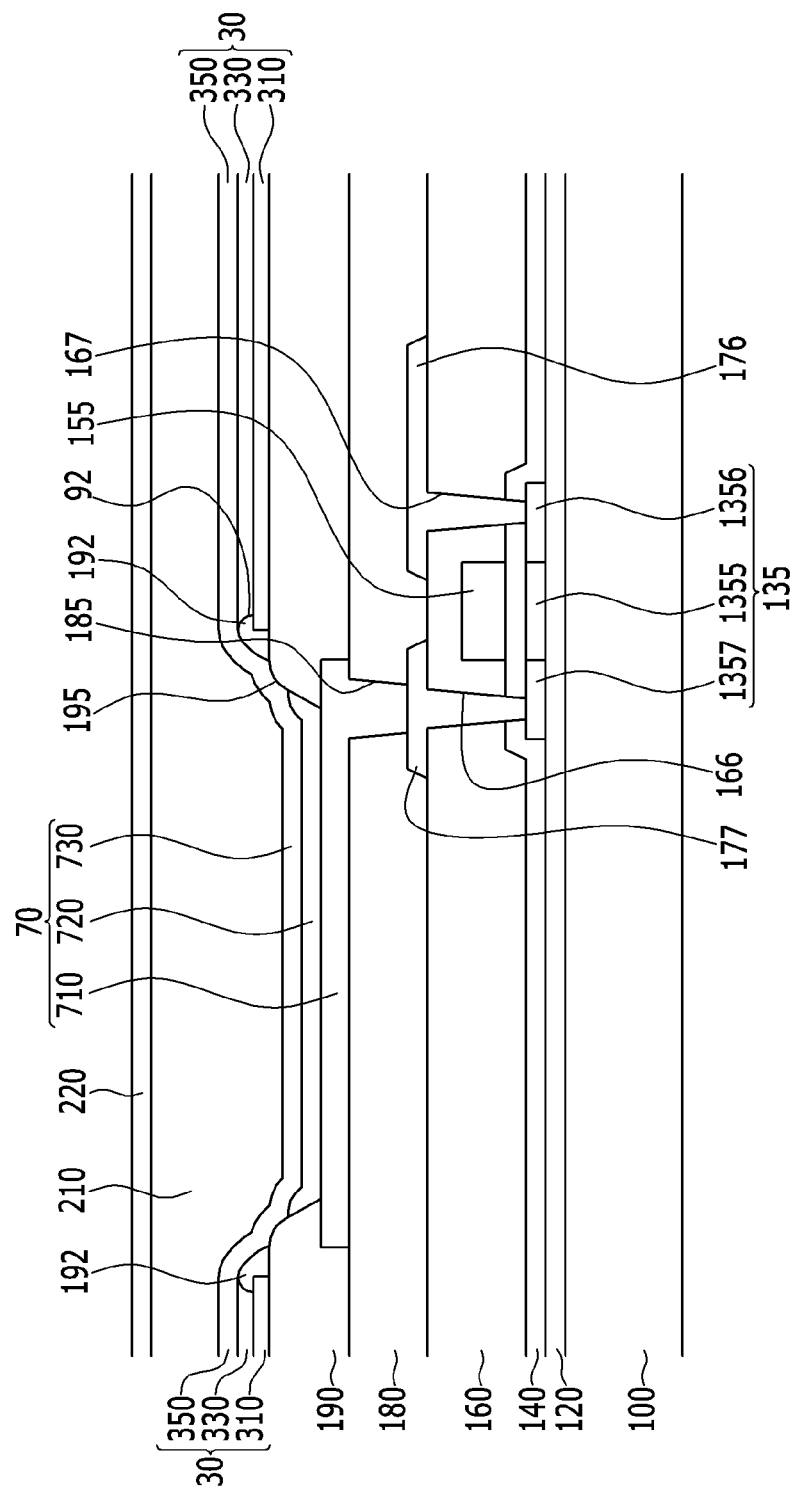
FIG. 6 is a cross-sectional view of an organic light emitting display panel according to another exemplary embodiment.

FIG. 6 is a cross-sectional view of an organic light emitting display panel according to another exemplary embodiment.

The organic light emitting display panel of FIG. 6 is the same as the organic light emitting display panel of FIG. 2 in structure, and only a different part will be described in further detail.

As shown in FIG. 6, the organic light emitting display panel includes a substrate 100, a buffering layer 120 disposed on the substrate 100, a semiconductor 130 disposed on the buffering layer 120, a gate insulating layer 140 disposed on the semiconductor 135, a gate electrode 155 disposed on the gate insulating layer 140, an interlayer insulating layer 160 disposed on the gate electrode 155, a source electrode 176 and a drain electrode 177 disposed on the interlayer insulating layer 160, a protective layer 180 disposed on the source electrode 176 and the drain electrode 177, and a lower electrode 710 disposed on the protective layer 180.

In addition, a pixel defining layer 190 including an opening that exposes the lower electrode 710 may be formed on the lower electrode 710, and an organic emission layer 720 may be formed in the opening 195.

Unlike the exemplary embodiment of FIG. 2, the pixel defining layer 190 does not include a recess portion, and an auxiliary lower electrode 310 may be formed on the pixel defining layer 190.

In addition, an auxiliary insulating layer 192 including an opening 92 that exposes the auxiliary lower electrode 310 may be formed on the auxiliary lower electrode 310 and the pixel defining layer 190, and an auxiliary organic emission layer 330 may be formed in the opening 92.

That is, unlike FIG. 2, the auxiliary lower electrode 310 may be formed on the pixel defining layer 190 and thus the auxiliary insulating layer 192 that covers the edge of the auxiliary lower electrode 310 may be formed to prevent short-circuit with the upper electrode 730.

The upper electrode 730 and an auxiliary upper electrode 530 are formed on the organic emission layer 720, the auxiliary organic emission layer 330, and the auxiliary insulating layer 192.

In addition, a filler 210 may be formed on the upper electrode 730 and the auxiliary upper electrode 350, and a window 220 may be attached on the filler 210.

FIG. 7A to FIG. 7H are color layout views of a portable display device in a standby state according to an exemplary embodiment.

As shown in FIG. 7A to FIG. 7H, a portable display device can provide aesthetic beauty while in a standby state by forming the auxiliary organic light emitting element as in the exemplary embodiment. The standby state is an off state during which a display area of the portable display device does not display an image, and it may be a reception standby state or a communication use standby state for a portable phone.

Since the display area 27 does not display an image during the standby state, the organic light emitting element is no more driven and an auxiliary organic light emitting element that neighbors the pixel starts to be driven. Thus, the display area 27 in the standby state displays various colors as shown in FIG. 7A to FIG. 7H according to a color of light emitted from the auxiliary organic emission layer of the auxiliary organic light emitting element.

The auxiliary organic emission layer of the auxiliary organic light emitting element may have a light emission layer that emits light of a color that matches a color of the light blocking unit 25.

Figure 7A:
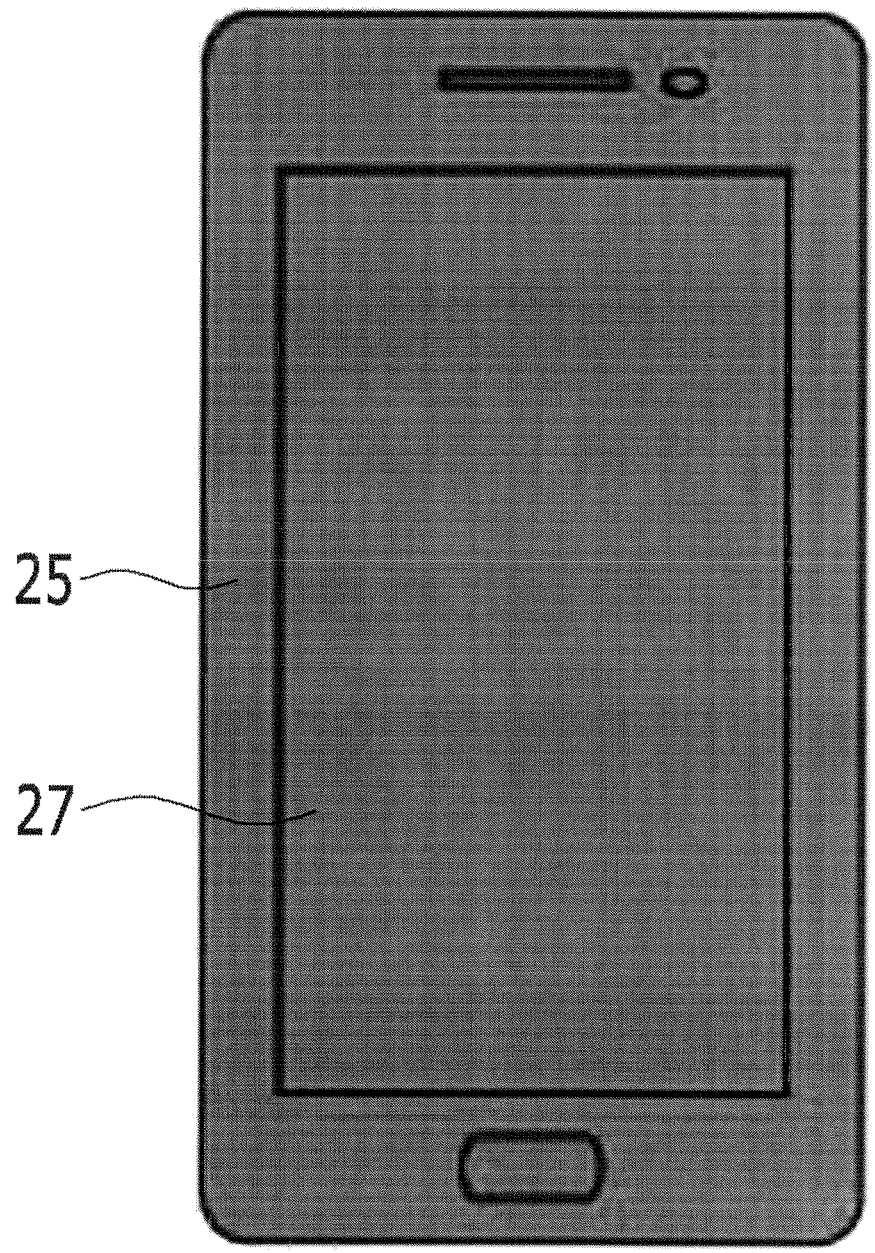
FIG. 7A to FIG. 7H are layout views of a portable display device in a standby state according to another exemplary embodiment.
Figure 7B:
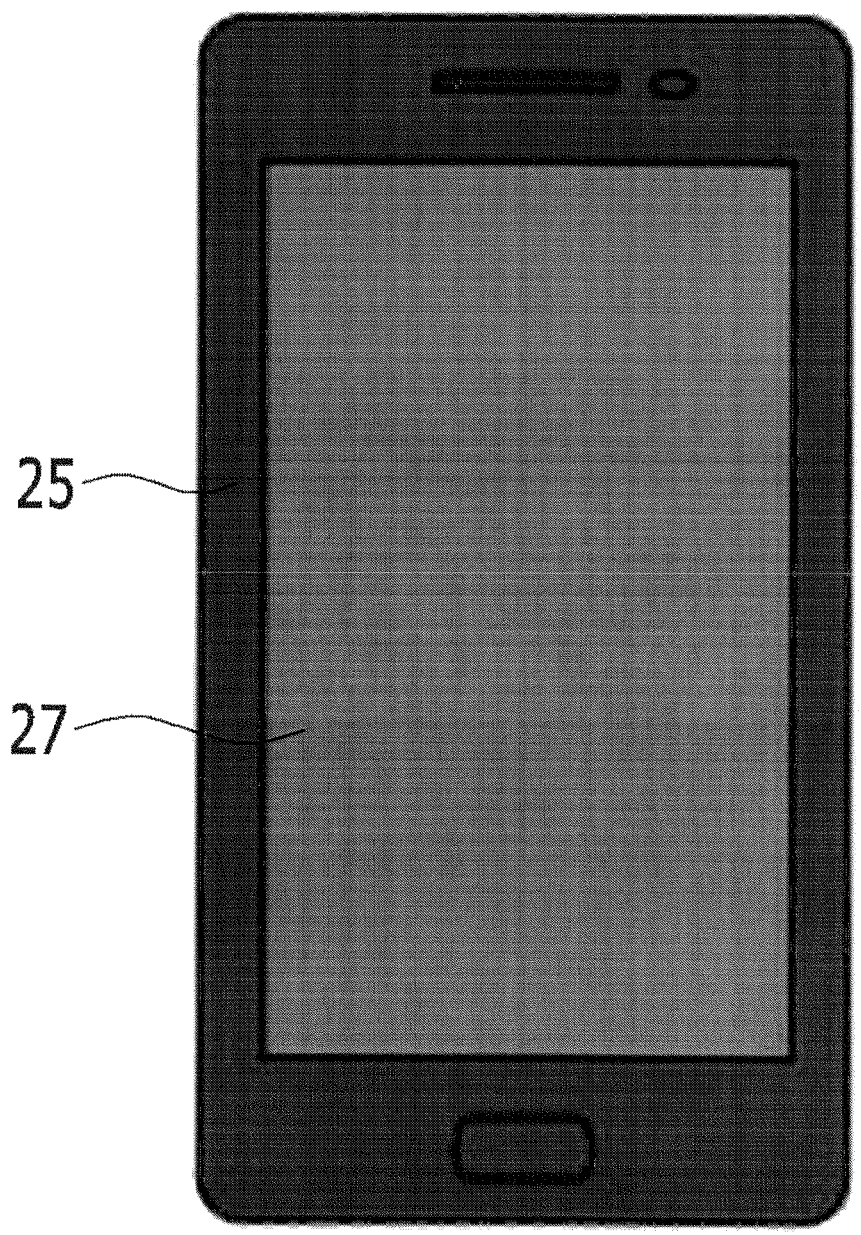
Figure 7C:
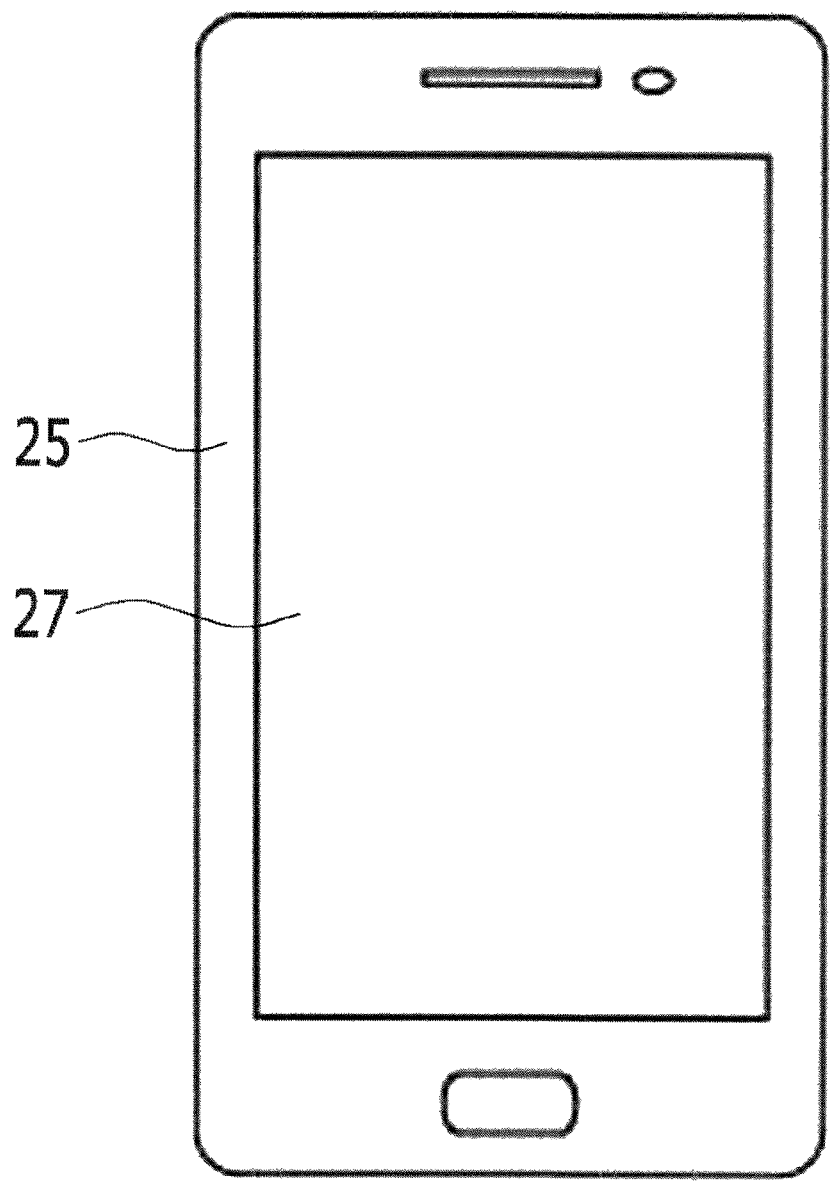
Figure 7D:
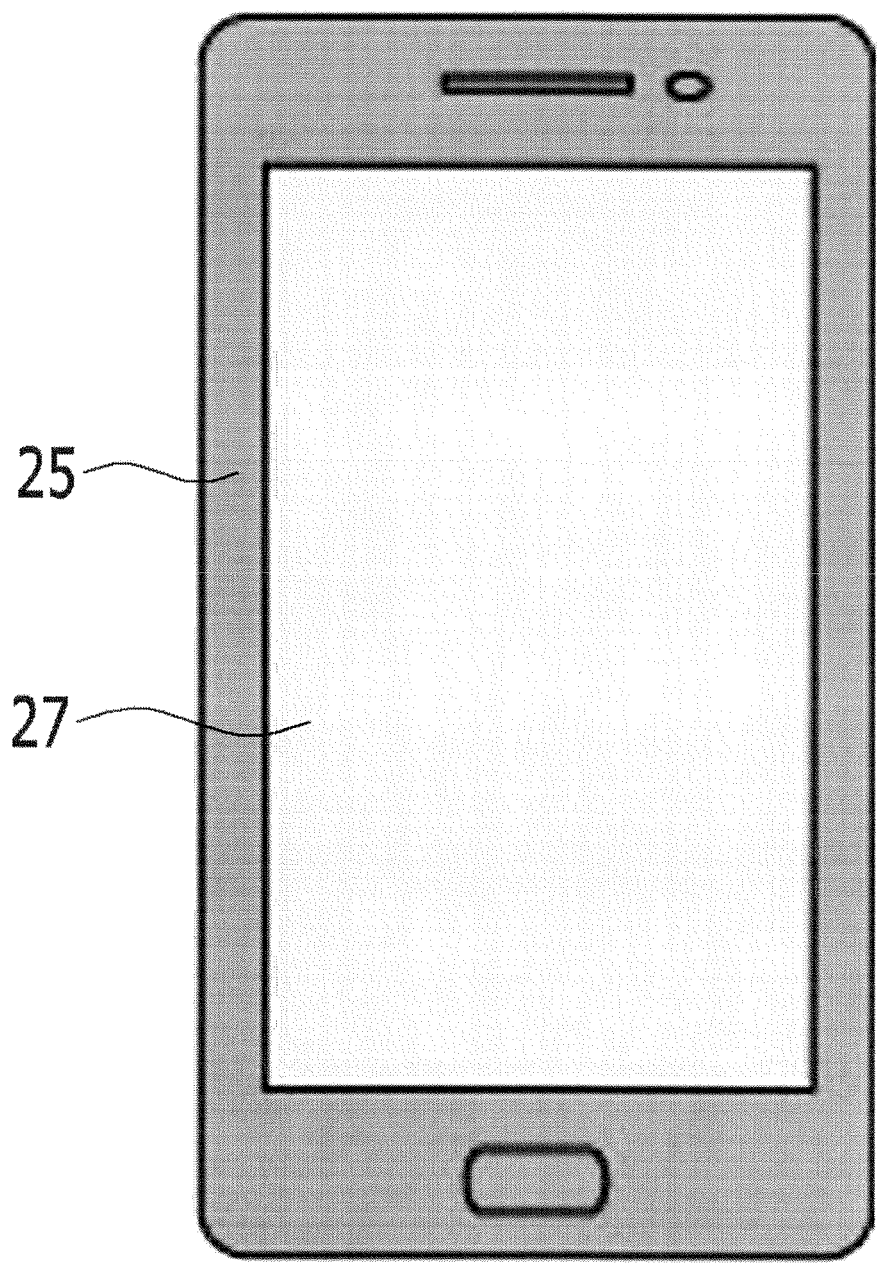

Thus, the display area 27 may display only one color as shown in FIG. 7A to FIG. 7D, may display the same color of the light blocking unit 25 as shown in FIG. 7A, or may display a complementary color of the light blocking unit 23 as shown in FIG. 7B.

Figure 7E:
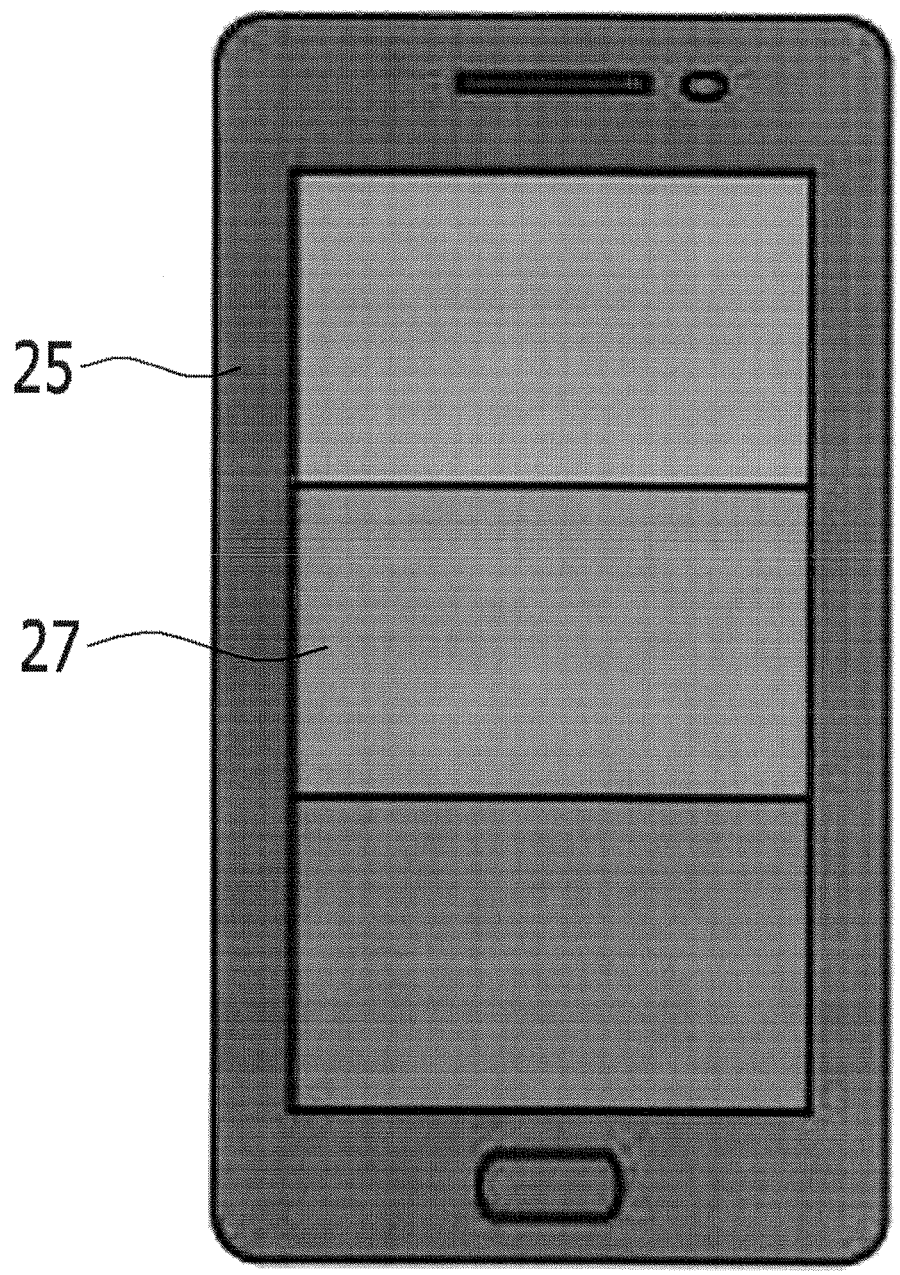
Figure 7F:
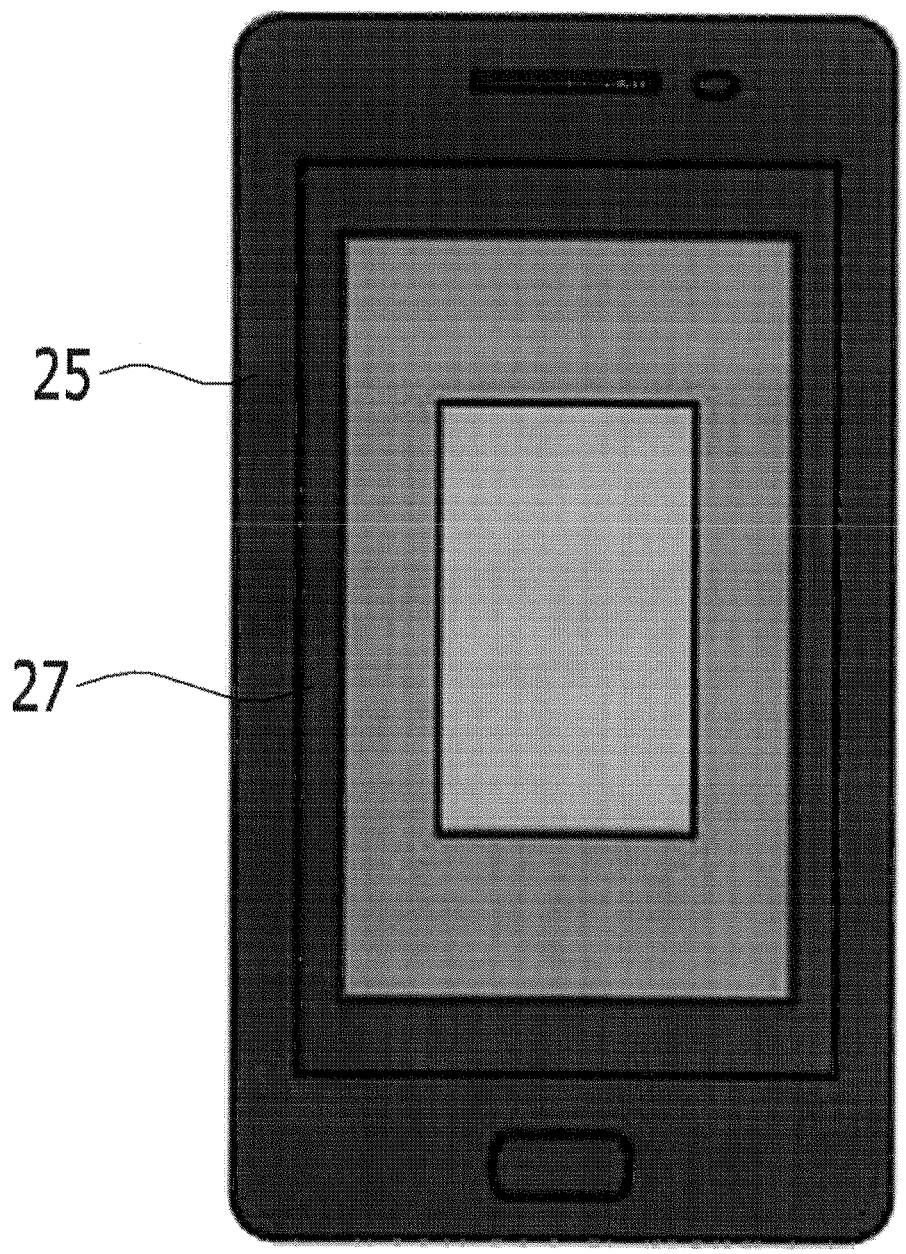
Figure 7G:
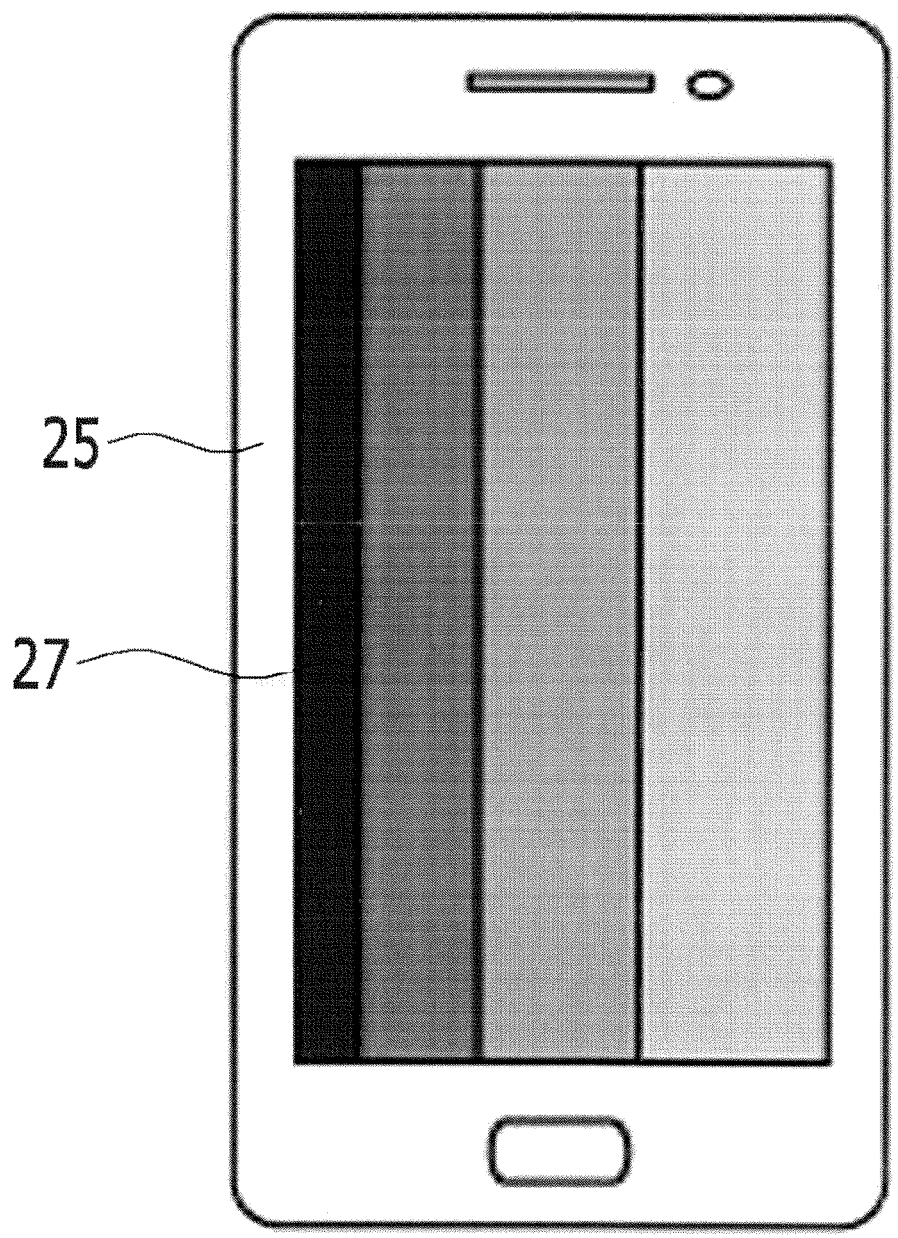
Figure 7H:
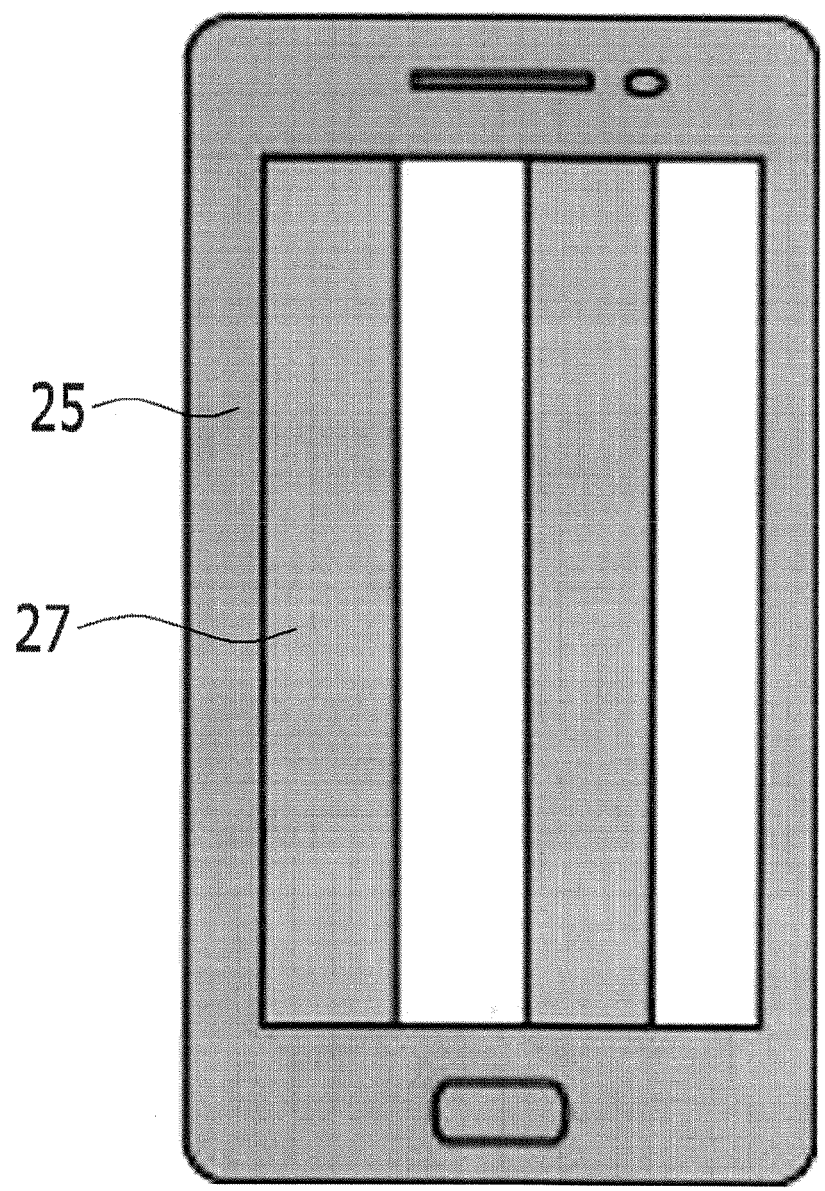

In addition, a wavelength of the same color may be gradually changed as shown in FIG. 7E to FIG. 7G, or different colors may be alternately displayed as shown in FIG. 7H. Further, colors may be displayed in a mosaic shape (not shown).

Such a color display can be achieved by dividing a display area into various shapes when forming the auxiliary organic light emitting element and forming the auxiliary light emission layer that can emit light of a desired color for a divided area.

As described, the display area of the display device in the standby state can display chromatic colors by forming the auxiliary organic light emitting element as in the exemplary embodiment so that the portable display device can provide aesthetic beauty in the standby state. Accordingly, a user can select a portable display device that can display a user-desired color.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic emitting display panel, comprising:
   a substrate;
   a plurality of pixels disposed on the substrate and forming a matrix, each pixel of the plurality of pixels includes a first thin film transistor disposed on the substrate and an organic light emitting element connected with the first thin film transistor, the organic light emitting element includes a lower electrode, an organic emission layer disposed on the lower electrode, and an upper electrode disposed on the organic emission layer;
   an auxiliary organic light emitting element disposed at a distance from the plurality of pixel, the auxiliary organic light emitting element includes an auxiliary lower electrode, an auxiliary organic emission layer disposed on the auxiliary lower electrode, and an auxiliary upper electrode disposed on the auxiliary organic emission layer; and
   a pixel defining layer surrounding and in direct contact with the lower electrode and the organic emission layer having a recess portion formed by removing a part of the pixel defining layer,
   wherein the auxiliary lower electrode is disposed on a part of the pixel defining layer and both said auxiliary lower electrode and said auxiliary organic emission layer are contained in the recess portion.

2. The organic light emitting display panel of claim 1, wherein the lower electrode and the auxiliary lower electrode are insulated from each other.

3. The organic light emitting display panel of claim 2, wherein the upper electrode and the auxiliary upper electrode are integrally formed.

4. The organic light emitting display panel of claim 1, wherein the auxiliary organic light emitting element is disposed between the respective pixels.

5. The organic light emitting display panel of claim 1, wherein the auxiliary organic light emitting element surrounds the pixels.

6. An organic light emitting display panel, comprising:
   a substrate;
   a gate line disposed on the substrate;
   a data line and a constant voltage line crossing the gate line in an insulated manner;
   a first thin film transistor connected with the gate line and the data line;
   a second thin film transistor connected with the first thin film transistor and the constant voltage line;
   a lower electrode connected with the second thin film transistor;
   a pixel defining layer disposed on the first lower electrode and exposing the lower electrode;
   a recess portion formed in the pixel defining layer by removing a part of the pixel defining layer;
   an organic emission layer disposed in the opening;
   an auxiliary lower electrode disposed entirely within and in direct contact with the recess portion on the pixel defining layer;
   an auxiliary organic emission layer disposed on the auxiliary lower electrode, both said auxiliary lower electrode and said auxiliary organic emission layer are contained in the recess portion;
   an upper electrode disposed on the organic emission layer; and
   an auxiliary upper electrode disposed on the auxiliary organic emission layer.

7. The organic light emitting display panel of claim 6, wherein the upper electrode and the auxiliary upper electrode are integrally formed.

8. The organic light emitting display panel of claim 6, wherein a signal that is different from signals applied to the data line and the constant voltage line is applied to the auxiliary lower electrode.

9. The organic light emitting display panel of claim 6, wherein the same signal applied to the constant voltage line is applied to the auxiliary lower electrode.

* * * * *